United States Patent
Hsiao et al.

(10) Patent No.: US 10,536,020 B2
(45) Date of Patent: Jan. 14, 2020

(54) CHARGING CONTROL APPARATUS, CHARGING CONTROL METHOD AND COMPUTER READABLE MEDIUM THEREOF

(71) Applicant: NATIONAL CHUNG SHAN INSTITUTE OF SCIENCE AND TECHNOLOGY, Taoyuan (TW)

(72) Inventors: Wei-Min Hsiao, Taoyuan (TW); Hsun-Ming Hsien, Taoyuan (TW); Kuo-Kuang Jen, Taoyuan (TW); Gwo-Huei You, Taoyuan (TW); Jung-Zong Wu, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 247 days.

(21) Appl. No.: 15/787,755

(22) Filed: Oct. 19, 2017

(65) Prior Publication Data
US 2019/0123565 A1    Apr. 25, 2019

(51) Int. Cl.
*H02J 7/00* (2006.01)
*G01R 31/374* (2019.01)
*G01R 31/387* (2019.01)

(52) U.S. Cl.
CPC ............ *H02J 7/007* (2013.01); *G01R 31/374* (2019.01); *G01R 31/387* (2019.01); *H02J 7/0029* (2013.01)

(58) Field of Classification Search
CPC .......... H02J 7/007; H02J 7/047; H02J 7/0073; H02J 7/0091; H01M 10/60; G01R 31/3675; G01R 31/3679; B60L 11/187; B60L 11/1857; B60L 58/24
USPC .................................................. 320/144, 153
See application file for complete search history.

(56) References Cited

U.S. PATENT DOCUMENTS

| | | | | |
|---|---|---|---|---|
| 2015/0377976 | A1* | 12/2015 | Maluf | H02J 7/0047 702/63 |
| 2016/0149418 | A1* | 5/2016 | Jung | H02J 7/0091 320/107 |
| 2017/0077720 | A1* | 3/2017 | Aronov | H02J 7/007 |

* cited by examiner

*Primary Examiner* — Paul Dinh
(74) *Attorney, Agent, or Firm* — Schmeiser, Olsen & Watts, LLP

(57) ABSTRACT

A charging control method includes the following. (a) An electrical state of a battery set is obtained. (b) Whether the electrical state is greater than a first electrical state threshold is determined and charging control based on a first charging mode or a second charging mode on the battery set is performed accordingly. (c) During the charging control on the battery set, at least one temperature difference value is determined based on temperature values of the battery set at different times. (d) Whether the temperature difference value is greater than a first temperature difference threshold is determined and whether to temporarily stop or continue the charging is determined accordingly. (e) During the charging control on the battery set, the electrical state is obtained, and whether the electrical state satisfies a fully-charged criterion is determined and whether to stop or continue the charging control is determined accordingly.

14 Claims, 9 Drawing Sheets

CHARGING CONTROL APPARATUS, CHARGING CONTROL METHOD AND COMPUTER READABLE MEDIUM THEREOF

FIELD OF THE INVENTION

The present disclosure relates to charging control technology, and in particular to charging control apparatus, charging control method and computer readable medium thereof.

BACKGROUND OF THE INVENTION

There are a number of conventional approaches to battery charging such as constant voltage charging method, constant current charging method, trickle charging method, and pulse charging method. These charging approaches vary in the charging speed, the impact on the battery life, the complexity of the circuit implementation, and the cost. It is discussed briefly as below.

The constant voltage charging method provides a constant voltage to charge the battery from the beginning to the end of charging. In the beginning of charging the battery, the charging voltage is greater than the battery voltage. The battery produces high current, so the sudden rise in temperature occurs in the battery. As the battery capacity increases, the battery voltage will be close to the voltage provided by the charger. At this situation, the charging time increases although the internal current of the battery is reduced.

Constant current charging method provided a constant and large current to charge the battery from the beginning to the end of charging. Although the charging time will be greatly reduced, the battery will produce a higher temperature, resulting in a lower battery life. If the battery is charged with a smaller constant current, the relative temperature is lower and the charging time is increased.

Trickle charge method is a two-stage charging, wherein a large current is applied to the battery in the beginning stage of charging and a small current is employed for charging in the last stage. This method can protect the battery and extends the battery life, but this method cannot determine whether the battery is fully charged.

In the pulse charging method, a constant current is initially applied to charge the battery, charging is then stopped temporarily for a period of time, and the charging continues with a constant current. This method can increase the battery charging efficiency because the charging is stopped temporarily for a period of time, and hence a maximum current that the battery can withstand is provided, and the charging time is reduced.

From the above discussion, the constant voltage charging method is simple in circuit design, but the charging speed is slow. The constant current charging method is simple in circuit implementation design and fast in charging, but the charge current is large and may damage the battery. The pulse charging method can reduce the charging time and extend the battery life, but the disadvantage is the high cost and the implementation is relatively difficult. Additionally, the constant current and constant voltage charging method is simple, but the charging speed is still slow.

Therefore, the conventional charging approaches vary in the charging speed, the impact on the battery life, the complexity of the circuit implementation, and the cost. It is desirable to have improvements on the charging method.

SUMMARY OF THE INVENTION

An objective of the present disclosure is to provide a charging control technique, which is capable of automatically selecting a charging mode of high efficiency and low temperature rise, based on criteria of dynamic state(s) of a battery set, such as criteria of at least one of a voltage, a remaining capacity and a temperature of the battery set.

To achieve at least the above objective, the present disclosure provides a charging control apparatus comprising: a memory unit and a processing unit. The processing unit, coupled to the memory unit, is configured to: obtain an electrical state of a battery set from a battery management unit; determine whether the electrical state is greater than a first electrical state threshold and accordingly perform charging control based on a first charging mode or a second charging mode on the battery set; during performing the charging control on the battery set, determine at least one temperature difference value based on temperature values of the battery set at different times obtained from the battery management unit; determine whether the temperature difference value is greater than a first temperature difference threshold and accordingly determine whether to temporarily stop or continue the charging of the battery set; and during performing the charging control on the battery set, obtain the electrical state of the battery set from the battery management unit, and determine whether the electrical state satisfies a fully-charged criterion and accordingly determine whether to stop or continue the charging control of the battery set.

In an embodiment of the present disclosure, the charging control apparatus further comprises: a device communication unit, coupled to the processing unit, for communication between the battery management unit and a programmable charger.

In an embodiment of the present disclosure, when the processing unit determines that the electrical state is greater than the first electrical state threshold, the processing unit performs the charging control based on the first charging mode on the battery set; when the processing unit determines that the electrical state is less than or equal to the first electrical state threshold, the processing unit performs the charging control based on the second charging mode on the battery set.

In an embodiment of the present disclosure, the processing unit at least sends a first control signal so as to apply a first charging current, based on the first charging mode, for charging the battery set.

In an embodiment of the present disclosure, during performing the charging control based on the second charging mode on the battery set, the processing unit sends a plurality of second control signals individually so as to apply corresponding second charging currents for charging the battery set, wherein the first charging current corresponding to the first control signal is less than the second charging currents corresponding to the second control signals.

In an embodiment of the present disclosure, when the processing unit determines that the temperature difference value is greater than the first temperature difference threshold, the processing unit temporarily stops charging on the battery set; when the processing unit determines that the temperature difference value is less than or equal to the first temperature difference threshold, the processing unit continues charging on the battery set.

To achieve at least the above objective, the present disclosure further provides a charging control method, comprising: (a) obtaining an electrical state of a battery set from a battery management unit; (b) determining whether the electrical state is greater than a first electrical state threshold and accordingly performing charging control based on a first charging mode or a second charging mode on the battery set; (c) during performing the charging control on the battery set, determining at least one temperature difference value based on temperature values of the battery set at different times obtained from the battery management unit; (d) determining whether the temperature difference value is greater than a first temperature difference threshold and accordingly determining whether to temporarily stop or continue the charging of the battery set; and (e) during performing the charging control on the battery set, obtaining the electrical state of the battery set from the battery management unit, and determining whether the electrical state satisfies a fully-charged criterion and accordingly determining whether to stop or continue the charging control of the battery set.

In an embodiment of the present disclosure, in the step (b), if it is determined that the electrical state is greater than the first electrical state threshold, the charging control is performed based on the first charging mode on the battery set; if it is determined that the electrical state is less than or equal to the first electrical state threshold, the charging control is performed based on the second charging mode on the battery set.

In an embodiment of the present disclosure, in the step (b), performing the charging control based on a first charging mode comprises: sending a first control signal so as to apply a first charging current for charging the battery set; during performing the charging control based on the second charging mode on the battery set, sending a plurality of second control signals individually so as to apply corresponding second charging currents for charging the battery set, wherein the first charging current corresponding to the first control signal is less than the second charging currents corresponding to the second control signals.

In an embodiment of the present disclosure, in the step (d), if it is determined that the temperature difference value is greater than the first temperature difference threshold, the charging on the battery set is temporarily stopped; if it is determined that the temperature difference value is less than or equal to the first temperature difference threshold, the charging on the battery set is continued.

To achieve at least the above objective, the present disclosure further provides a non-transitory computer readable medium, in which program code is stored for causing a computing device to perform a charging control method. The method comprises: (a) obtaining an electrical state of a battery set; (b) determining whether the electrical state is greater than a first electrical state threshold and accordingly performing charging control based on a first charging mode or a second charging mode on the battery set; (c) during performing the charging control on the battery set, obtaining temperature values of the battery set at different times so as to determine at least one temperature difference value; (d) determining whether the temperature difference value is greater than a first temperature difference threshold and accordingly determining whether to temporarily stop or continue the charging of the battery set; and (e) during performing the charging control on the battery set, obtaining the electrical state of the battery set, and determining whether the electrical state satisfies a fully-charged criterion and accordingly determining whether to stop or continue the charging control of the battery set.

In an embodiment of the present disclosure, in the step (b), if it is determined that the electrical state is greater than the first electrical state threshold, the charging control is performed based on the first charging mode on the battery set; if it is determined that the electrical state is less than or equal to the first electrical state threshold, the charging control is performed based on the second charging mode on the battery set.

In an embodiment of the present disclosure, in the step (b), performing the charging control based on a first charging mode comprises: sending a first control signal so as to apply a first charging current for charging the battery set; during performing the charging control based on the second charging mode on the battery set, sending a plurality of second control signals individually so as to apply corresponding second charging currents for charging the battery set, wherein the first charging current corresponding to the first control signal is less than the second charging currents corresponding to the second control signals.

In an embodiment of the present disclosure, in the step (d), if it is determined that the temperature difference value is greater than the first temperature difference threshold, the charging on the battery set is temporarily stopped; if it is determined that the temperature difference value is less than or equal to the first temperature difference threshold, the charging on the battery set is continued.

DETAILED DESCRIPTION OF THE EMBODIMENT OF THE INVENTION

To make it easier for the examiner to understand the objects, characteristics and effects of this present disclosure, embodiments together with the attached drawings for the detailed description of the present disclosure are provided.

Figure 1:
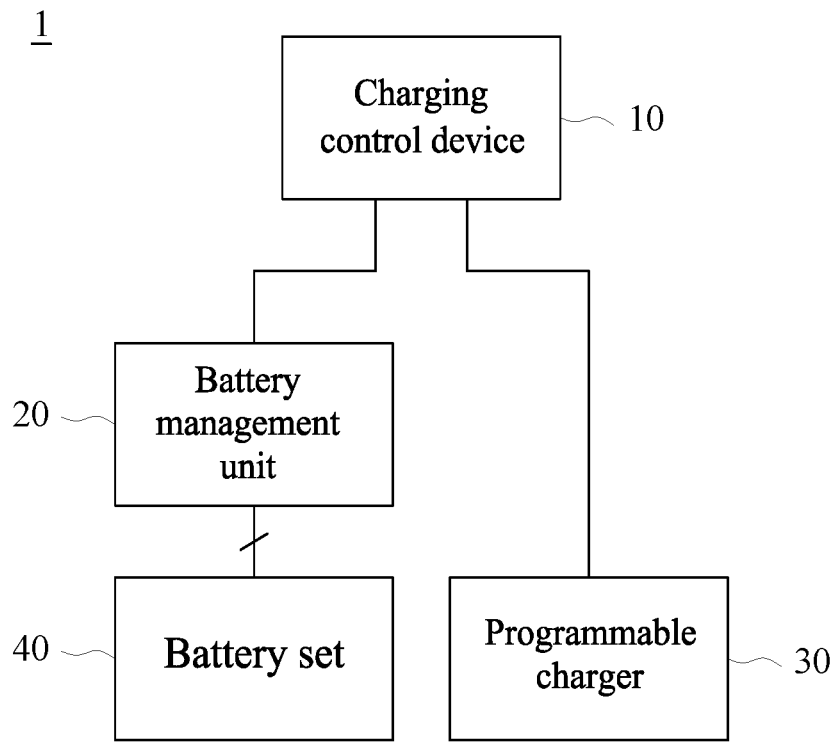
FIG. 1 is a block diagram illustrating a charging control device according to an embodiment of the present disclosure.

Referring to FIG. 1, a charging control device is illustrated according to an embodiment of the present disclosure in a block diagram form. As shown in FIG. 1, a charging management system 1 includes a charging control device 10, a battery management unit 20, and a programmable charger 30. For example, the charging management system 1 is a charging apparatus or a charging station for electric vehicles; and the charging control device 10 and the battery management unit 20 can be combined as a battery management module.

For example, the charging control device 10 can be implemented with any computing device which includes a memory unit and a processing unit, such as a microcontroller, digital signal processor, system on a chip, or computer. The charging control device 10 is employed for performing charging control on the battery set 40 by way of communicating with the battery management unit 20 and the programmable charger 30. For example, the charging control device 10 receives battery information outputted by the battery management unit 20, such as voltage, current, state of charge (SOC), remaining capacity, or battery state (e.g., idle, charging, or discharging) of the battery set 40. The charging control device 10 determines at least a charging control signal, based on an electrical state which indicates battery electricity quantity (e.g., battery voltage or remaining capacity) in the battery information of the battery set 40, and outputs the charging control signal to the programmable charger 30 so as to perform charging control on the battery set 40. In addition, the charging control signal includes a command for controlling the programmable charger 30, for example, a command to start charging, to set a charging voltage, to set a charging current, or to stop charging. The battery set 40 includes a plurality of batteries connected in series, in parallel, or in series and parallel, for example; in an example, a battery set made by connecting 8 to 16 batteries of 3.2V in series with a total voltage of 51.2V; but the present disclosure is not limited to the specification and way of connection of the battery set.

As mentioned above, the electrical state represents at least one or more parameters indicating battery electricity quantity, such as voltage, current, state of charge (SOC), remaining capacity. In implementation, the battery electricity quantity can be represented by using an appropriate parameter, according to the battery characteristic. For example, the remaining capacity will be represented by the state of charge in the following. However, the implementation of present disclosure is not limited to the type of parameter employed.

In addition, the charging control device 10 as illustrated in FIG. 1 can be used to implement any embodiment of a charging control method according to the present disclosure; and examples will be taken later.

In addition, for example, the battery management unit 20 can be a circuit, chip, or module for battery protection and monitoring, for monitoring battery's voltage, current, and temperature, or battery electricity quantity measurement. The battery management unit 20 may support the application such as lithium-ion and lithium polymer batteries; but the implementation of the present disclosure is not limited to the type of battery employed, so a battery management unit can be appropriately for the implementation of the present disclosure. Furthermore, for example, the programmable charger 30 may be a programmable DC power supply or a programmable charging circuit, which is capable of receiving commands to change the magnitude of the charging current, or voltage, or to stop charging temporarily.

Figure 2:
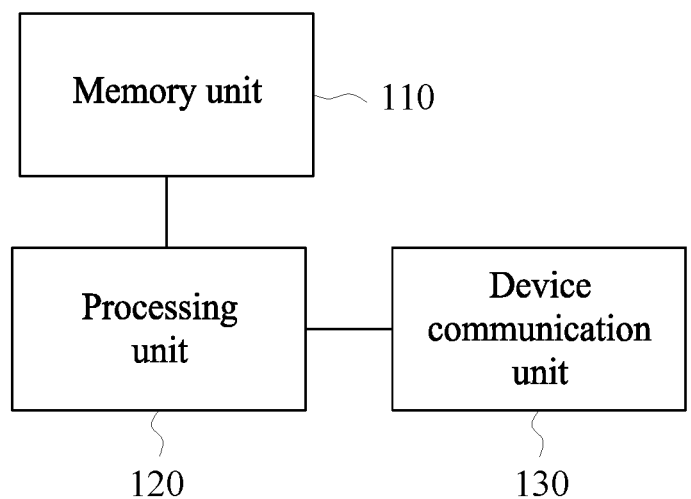
FIG. 2 is a block diagram of an embodiment of a charging control device.

In an embodiment as illustrated in FIG. 2, the charging control device 10 further includes a device communication unit 130, in addition to the memory unit 110, the processing unit 120. The device communication unit 130, coupled to the processing unit 120, is used for communicating with the battery management unit 20 and the programmable charger 30. As an example, the device communication unit 130 is a signal conversion module, which is employed to convert a signal outputted by the battery management unit 20 (e.g., a signal compliant with the communication protocol for Controller Area Network (CAN)) into a signal which can be interpreted by the charging control device 10 (e.g., a signal for USB or Universal Asynchronous Receiver/Transmitter (UART) such as RS232). In addition, the device communication unit 130 can be configured for signal conversion between the programmable charger 30 and the processing unit 120. For example, the battery management unit 20 or the programmable charger 30 can adopt: controller area network (CAN), RS422, RS485 or other communication protocol. In addition, the battery management unit 20 and the programmable charger 30 can be realized with the same communication protocol as that for the charging control device 10. Certainly, the implementation of the present disclosure is not limited to the above examples.

Figure 3:
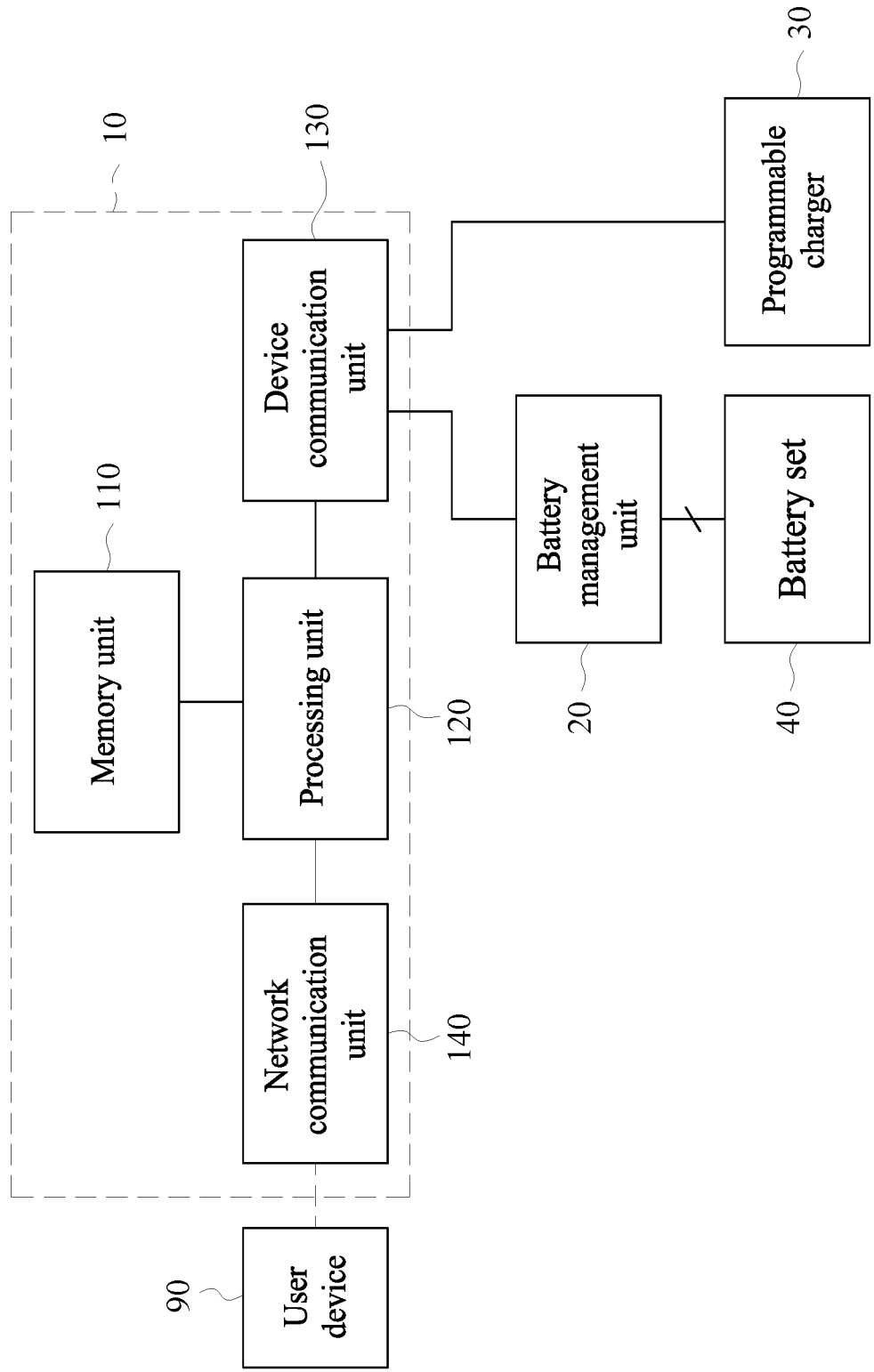
FIG. 3 is a block diagram of another embodiment of a charging control device.

Referring to FIG. 3, another embodiment of a charging control device is shown in a block diagram form. In FIG. 3, the charging control device 10 can further include a network communication unit 140. The network communication unit 140, coupled to the processing unit 120, is used for communication with a user device. The user device, for instance, is a computing device such as a smart device or a notebook computer, which is capable of communicating with the charging control device 10 by way of wireless or wired manner, monitoring battery information of the battery set 40, or performing operations of setting and configuration and so on. For example, the network communication unit 140 supports wireless communications, for example, at least one kind of communication technologies of: wireless communication network (e.g., Wi-Fi), near-field communication network (e.g., Bluetooth), and mobile communication network. In addition, the network communication unit 140 may support wired communication such as USB, local area communication network or any wired network technology. Certainly, the implementation of the present disclosure is not limited to the above examples.

Figure 4:
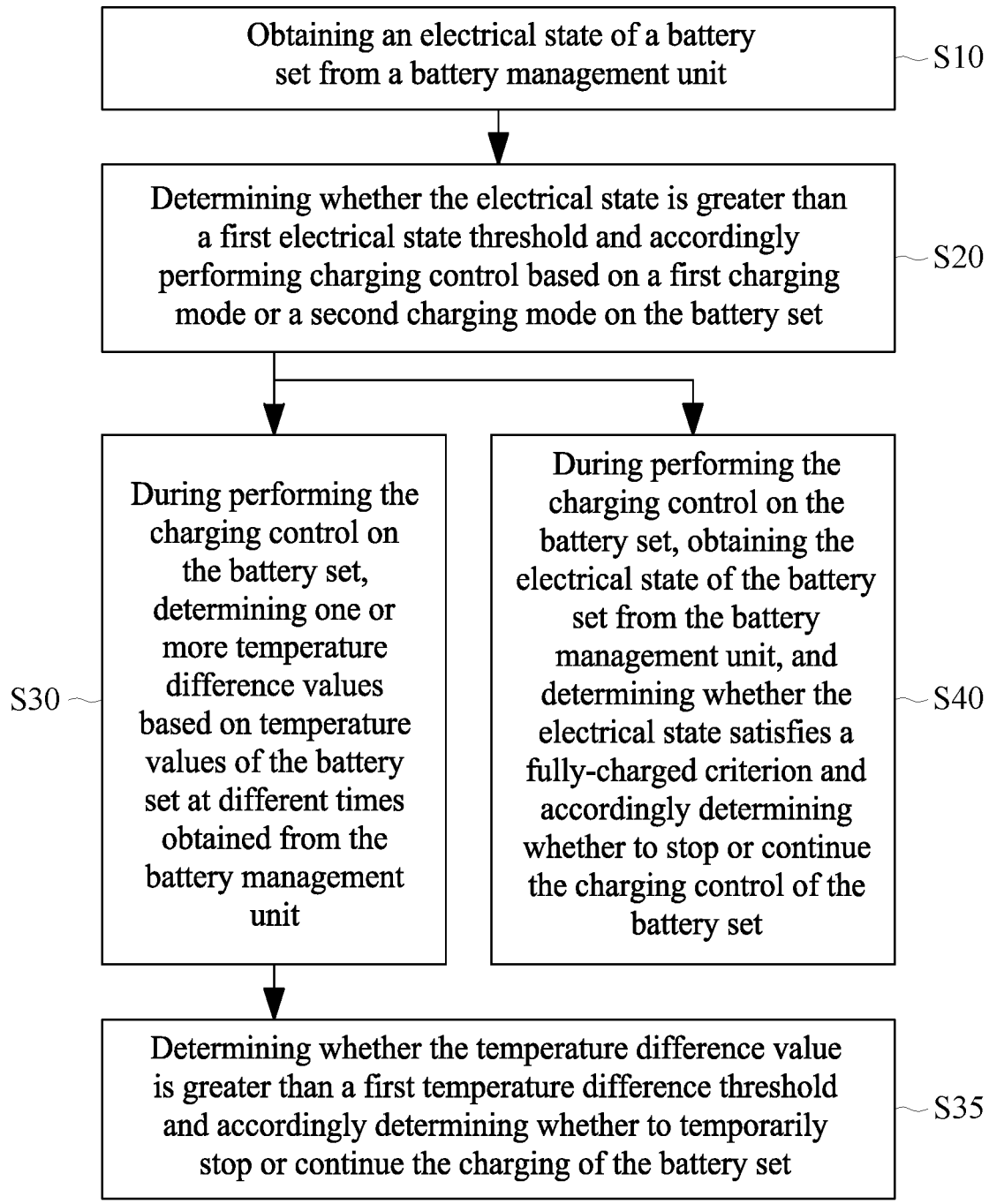
FIG. 4 is a flowchart illustrating a charging control method according to an embodiment of the present disclosure.

Referring to FIG. 4, a charging control method is illustrated according to an embodiment of the present disclosure in a flowchart form. The charging control method can be applied to any one of the embodiments of the charging control device as illustrated in FIGS. 1 to 3. As illustrated in FIG. 4, the charging control method includes the process as illustrated by blocks 10 to 40. In this way, the charging control device 10 automatically selecting a charging mode of high efficiency and low temperature rise, based on criteria of dynamic state(s) of a battery set, such as criteria of at least one of a voltage or a remaining capacity and a temperature of the battery set.

As shown at block S10, an electrical state of a battery set 40 is obtained from a battery management unit 20.

As shown at block S20, a determination is made as to whether the electrical state is greater than a first electrical state threshold and accordingly charging control based on a first charging mode or a second charging mode is performed on the battery set 40.

As shown at block S30, during performing the charging control on the battery set 40, one or more temperature difference values are determined based on temperature values of the battery set at different times obtained from the battery management unit 20.

As shown at block S35, a determination is made as to whether the temperature difference value is greater than a first temperature difference threshold and accordingly it is determined whether to temporarily stop or continue the charging of the battery set 40.

As shown at block S40, during performing the charging control on the battery set 40, the electrical state of the battery set is obtained from the battery management unit 20, and a determination is made as to whether the electrical state satisfies a fully-charged criterion and accordingly it is determined whether to stop or continue the charging control of the battery set 40.

Figure 5:
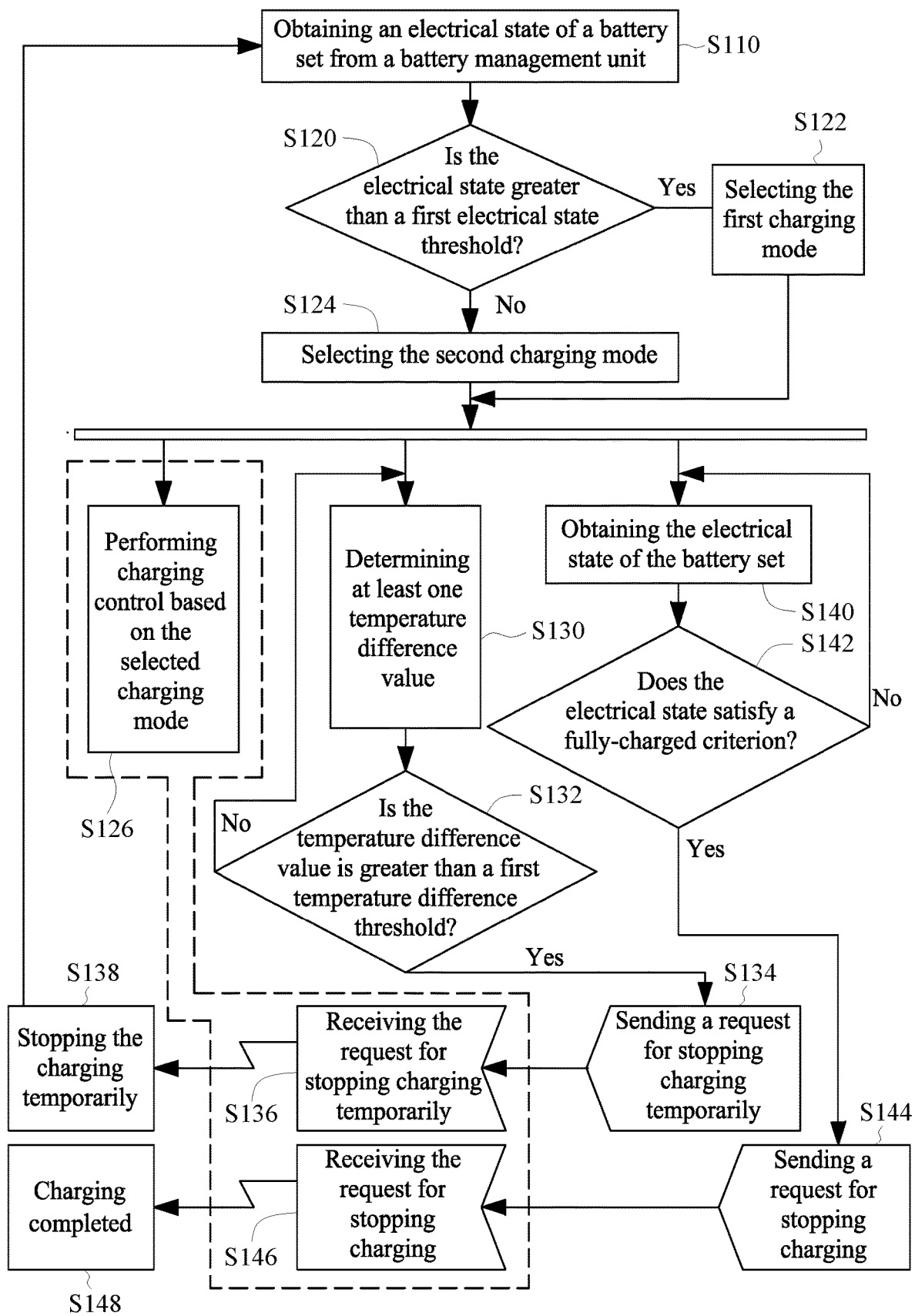
FIG. 5 is a procedure diagram according to an embodiment of a charging control method of FIG. 4.

Referring to FIG. 5, a procedure diagram is illustrated according to an embodiment of a charging control method of FIG. 4.

As illustrated at block S110 in FIG. 5, an electrical state of a battery set 40, for example, voltage or remaining capacity, is obtained from a battery management unit 20, according to block S10 as shown in FIG. 4.

As illustrated from blocks S120 to S126, an implementation according to block S20 in FIG. 4 is provided. As shown at block S120 in FIG. 5, a determination is made as to whether the electrical state is greater than a first electrical state threshold; for example, the first electrical state threshold indicates remaining capacity of 80%. As shown at block S122 in FIG. 5, if it is determined that the electrical state is greater than the first electrical state threshold, the first charging mode is selected and performed for charging control on the battery set 40. As shown at block S124 in FIG. 5, if it is determined that the electrical state is less than or equal to the first electrical state threshold, the second charging mode is selected and performed for charging control on the battery set 40. Block S126 in FIG. 5 indicates that charging control based on the selected one of the first charging mode and second charging mode is performed on the battery set 40.

As shown at block S130 in FIG. 5, during performing the charging control on the battery set, as indicated by block S126, at least one temperature difference value is determined based on temperature values of the battery set 40 at different times obtained from the battery management unit 20, according to block S30 in FIG. 4.

As shown at block S132 in FIG. 5, it is determined whether the temperature difference value is greater than a first temperature difference threshold, according to block S35 in FIG. 4, wherein the first temperature difference threshold indicates a rise in temperature of 5° C. If it is determined that the temperature difference value is less than or equal to the first temperature difference threshold, the charging on the battery set is continued. If it is determined that the temperature difference value is greater than the first temperature difference threshold, the charging on the battery set is temporarily stopped. For example, as indicated at block S134 in FIG. 5, a request for stopping charging temporarily is sent; as indicated at block S136, block S126, which performs the charging control, receives the request for stopping charging temporarily and then stops the charging temporarily; afterwards, as indicated at block S138, the method performs other processing: such as, stopping the charging temporarily for a time interval, e.g., 1, 2, or 5 minutes and so on; or the charging pauses until the temperature of the battery set 40 returns to a normal value, e.g., the method proceeds with the charging control if it is determined that the temperature difference value is less than the first temperature difference threshold.

As shown at block S140 in FIG. 5, during performing the charging control on the battery set 40, the electrical state of the battery set 40 is obtained from the battery management unit 20, according to block S40 in FIG. 4. As shown at block S142 in FIG. 5, a determination is made as to whether the electrical state satisfies a fully-charged criterion; for example, it is determined whether the electrical state is less than a second electrical state threshold, which indicates the remaining capacity of 100%. As shown at block S142 in FIG. 5, if it is determined that the electrical state is less than the second electrical state threshold, the method proceeds with the charging control of the battery set 40. As shown at block S144 in FIG. 5, if it is determined that the electrical state is equal to the second electrical state threshold, the method stops the charging control of the battery set 40. For example, as shown at block S144 in FIG. 5, a request for stopping charging is sent; as indicated at block S146, block S126, which performs the charging control, receives the request for stopping charging and then stops the charging; afterwards, as indicated at block S148, the method completes the charging, or may proceeds with other processing.

In addition, in another embodiment, the fully-charged criterion as indicated at block S142 in FIG. 5 can be set to be: when the difference between the voltage of the battery and a highest charging voltage is less than a threshold, e.g., 100 mV, and the charging current is reduced to C/10, the battery can be regarded as fully-charged. Thus, the implementation of present disclosure is not limited to the fully-charged criterion; that is, the criterion can be changed depending on the characteristics of the battery. For example, for a lithium-ion battery with a typical characteristic, the fully-charged criterion can be defined as: when the battery voltage is equal to a maximum charging voltage and the charging current is reduced to C/10, the battery is considered to be fully charged.

Figure 6:
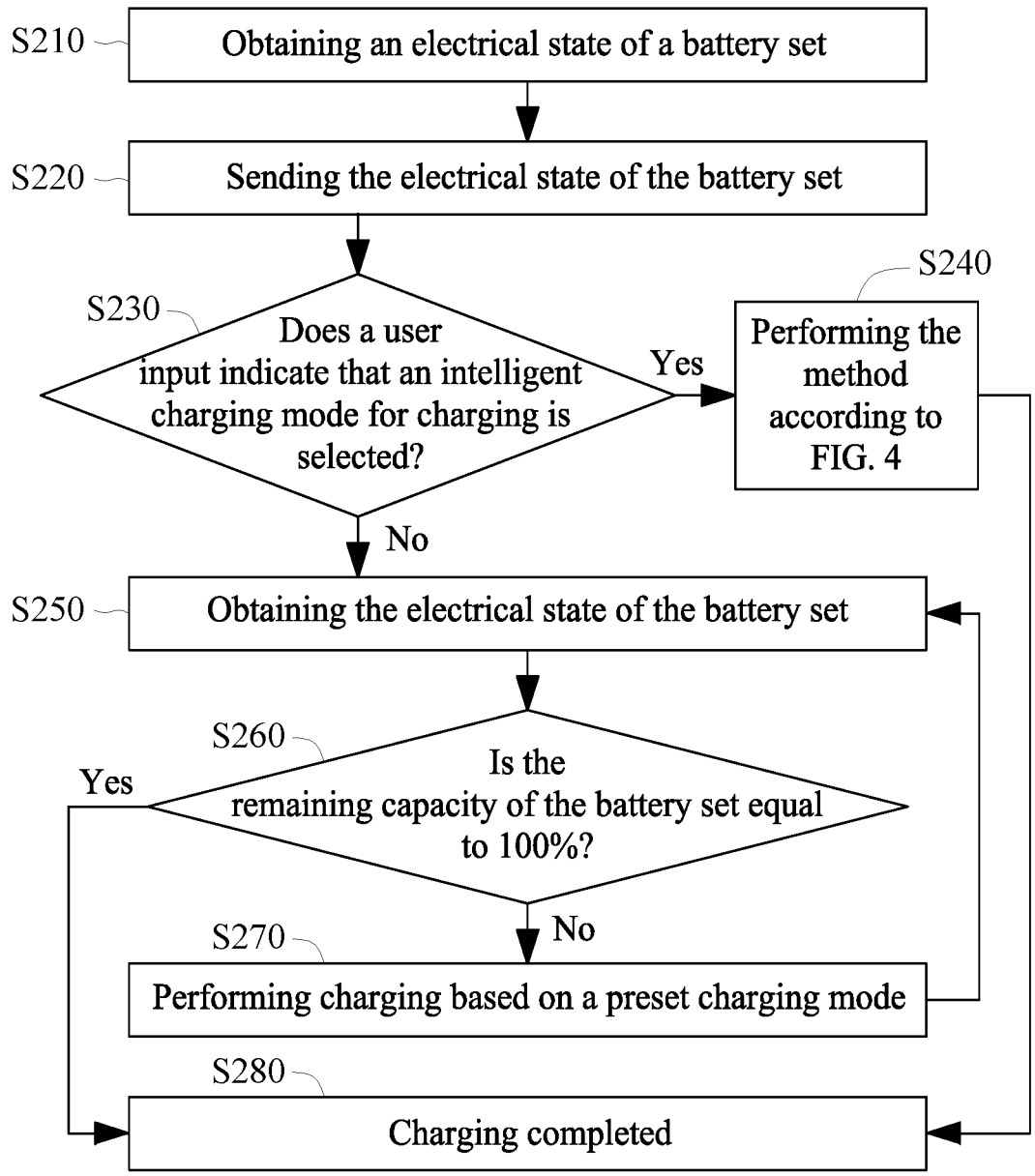
FIG. 6 is a flowchart illustrating a charging control method according to another embodiment of the present disclosure.

Referring to FIG. 6, a charging control method is illustrated according to another embodiment of the present disclosure in a flowchart form. The embodiment in FIG. 6 can be applied to any embodiment of the charging control device 10. As shown at block S210, an electrical state of a battery set 40 is obtained from a battery management unit 20. As shown at block S220, the electrical state, such as voltage, remaining capacity, and expected charging time, is sent to the battery set 40. As shown at block S230, a determination is made whether a user input indicates that an intelligent charging mode for charging is selected. As shown at block S240, if the user input indicates that an intelligent charging mode for charging is selected, then the method according to FIG. 4 is performed. If the user does not select the intelligent charging mode, a preset charging mode will be performed. As shown at block S250, the electrical state of the battery set 40, such as remaining capacity, is obtained. As shown at block S260, a determination is made whether the remaining capacity of the battery set 40 is equal to 100%. If not, as shown at block S270, charging is performed based on the preset charging mode. Block S280 indicates the completion of charging.

Additionally, according to block S20 in FIG. 4, for example, in the process as illustrated at blocks S120 to S126 in FIG. 5, the first charging mode for charging control can be a trickle charging mode; and the second charging mode for charging control can be a charging mode of a plurality of stages, wherein the charging current corresponding to the first charging mode is less than that corresponding to the second charging mode. For example, in the charging mode of a plurality of stages, the magnitude of the charging current is determined based on the voltage or remaining capacity of the battery set 40. In an instance of a charging mode of three stages, following the starting of the charging, three stages are performed for charging the battery set 40 with charging currents I1, I2, and I3, respectively, wherein I1>I2>I3. Initially, the first stage employs the charging current I1 for charging until the voltage (or remaining capacity) of the battery set 40 is greater than a corresponding threshold and the next stage is entered. The second stage employs the charging current I2 for charging until the voltage (or remaining capacity) of the battery set 40 is greater than or equal to another corresponding threshold and the next stage is entered. The third stage employs the charging current I3 for charging until the voltage (or remaining capacity) of the battery set 40 is greater than or equal to yet another corresponding threshold. Furthermore, in the transition from one stage to another stage, the charging can be stopped temporarily. Other charging mode of multiple-stages can be done in a similar manner and they will not be repeated for the sake of brevity.

In some embodiments, performing charging control based on the first charging mode includes: sending a first control signal so as to apply a first charging current for charging the battery set 40. During performing charging control based on the second charging mode on the battery set 40, a plurality of second control signals are sent in respective charging stages so as to apply corresponding second charging currents for charging the battery set 40, wherein the first charging current corresponding to the first control signal is less than the second charging current corresponding to the second control signal. In this way, a charging mode of high efficiency and low temperature rise, can be selected automatically based on criteria of dynamic state(s) of a battery set 40, such as criteria of at least voltage or remaining capacity, or temperature, of the battery set 40.

Examples will be taken in the following for illustration of the implementation of charging control according to block S20 of FIG. 4, which will be called an intelligent charging mode. In the following, the first charging mode is implemented by a trickle charging mode for charging control; the second charging mode is implemented by using a charging mode of at most five stages for charging control, wherein the charging current corresponding to the first charging mode is less than that corresponding to the second charging mode. In addition, each example will be compared with a constant current charging method. However, the implementation according to block S20 of FIG. 4 is not limited to the examples.

Example 1

Figure 7:
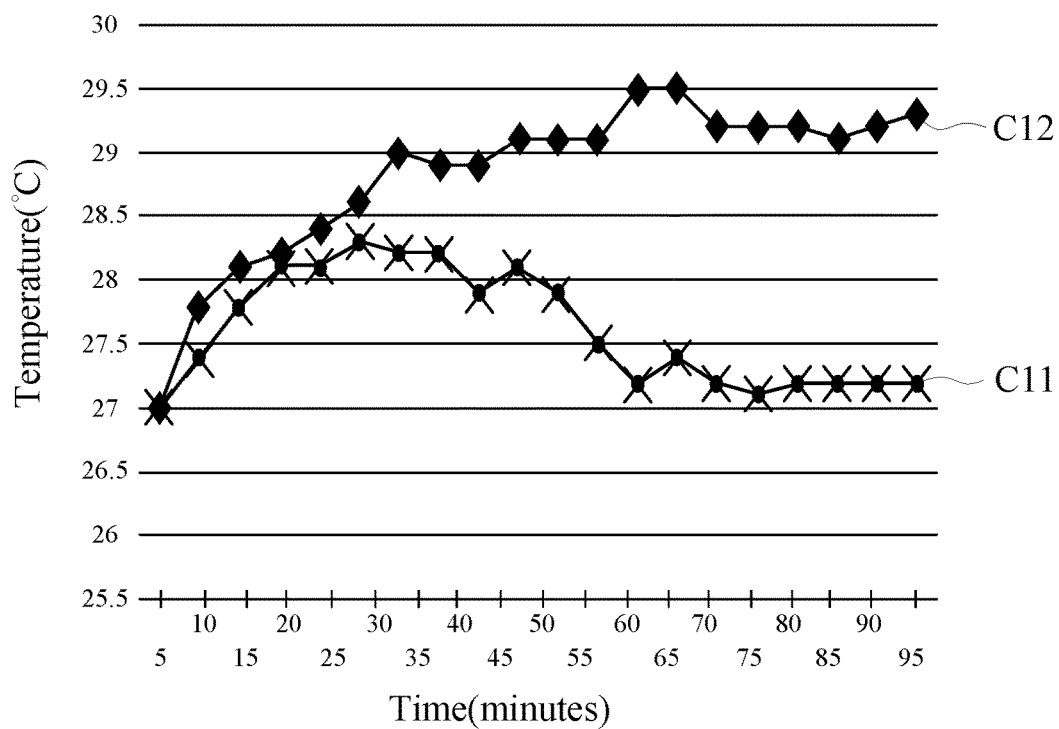
FIG. 7 is a diagram of battery temperature with respect to time, illustrating both tests respectively according to charging control as indicated in block S20 of FIG. 4, and a constant current charging method.

In example 1, a test is conducted for determination of charging parameters, wherein a maximum output current of 60 A (i.e., 1 C) is set for the test. The charging parameters for a five-stage charging mode are: 54 A (0.9 C), 49.5 A (0.825 C), 39 A (0.65 C), 31.5 A (0.525 C), 25.5 A (0.425 C); and a trickle charging parameter is: 9 A (0.15 C), wherein the corresponding charging currents decrease successively or in a stepwise manner and a voltage of 460V is set. Referring to FIG. 7, a diagram of battery temperature with respect to time illustrates both tests respectively according to charging control as indicated in block S20 of FIG. 4 (curve C11), and a constant current charging method (curve C12).

Example 2

Figure 8A:
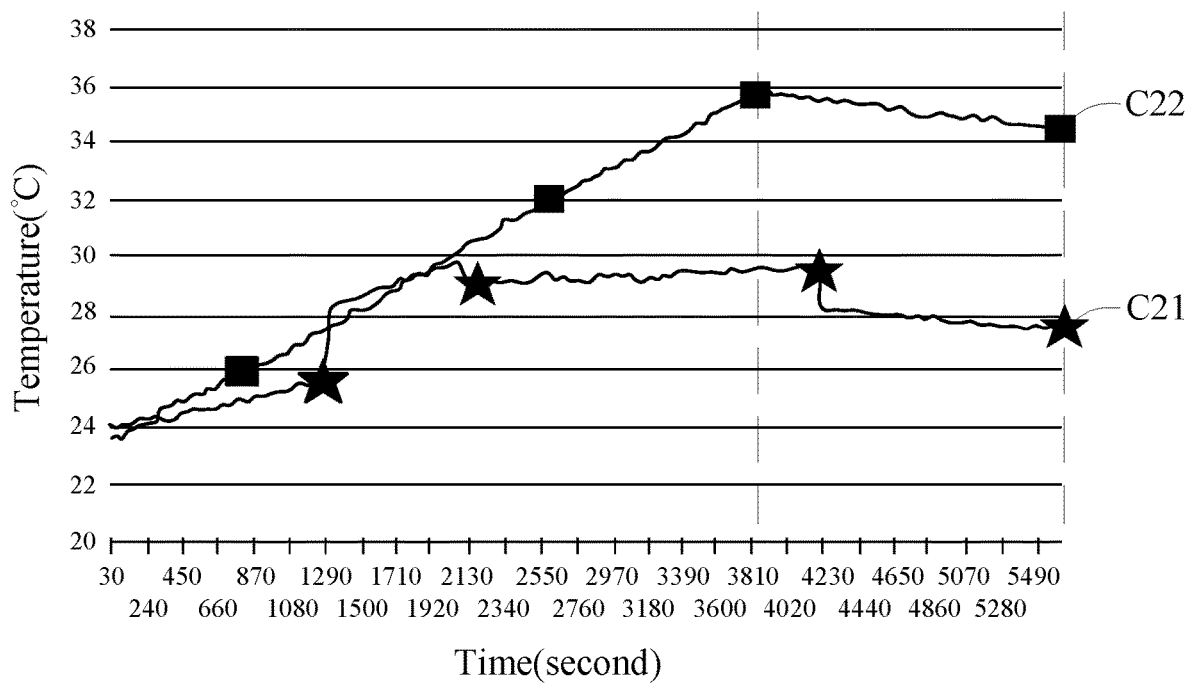
FIG. 8A is a diagram of battery temperature with respect to time, illustrating both tests respectively according to charging control as indicated in block S20 of FIG. 4, and a constant current charging method.
Figure 8B:
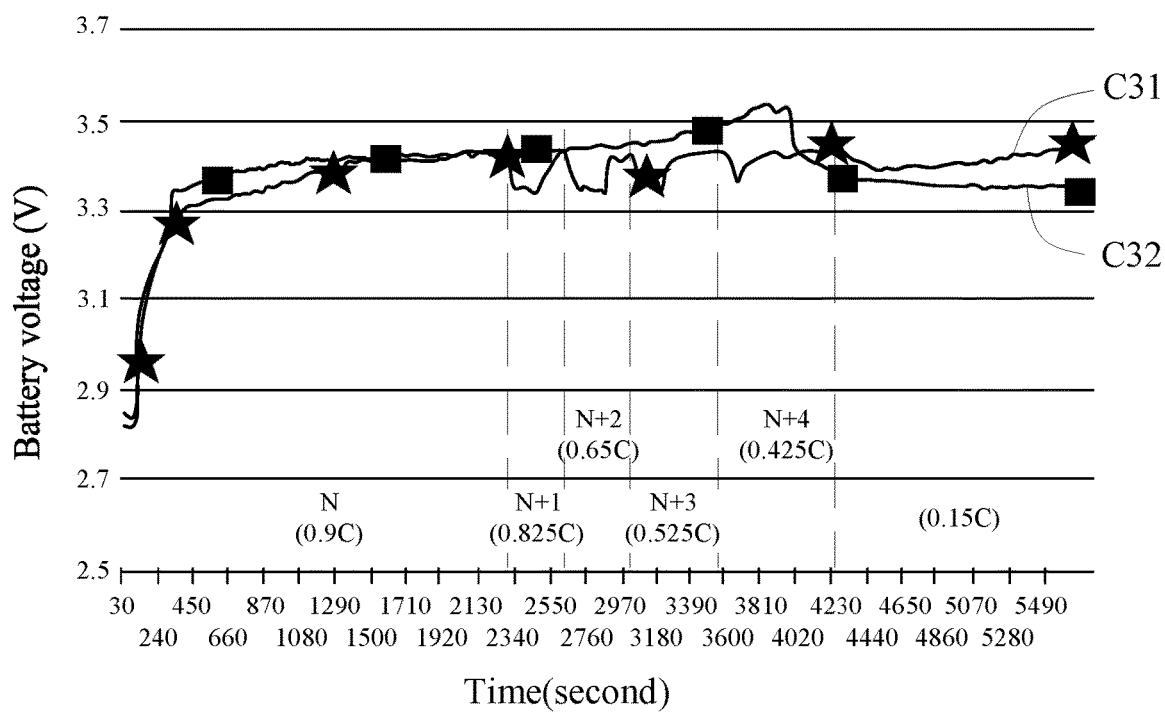
FIG. 8B is a diagram of battery voltage with respect to time, illustrating both tests respectively according to charging control as indicated in block S20 of FIG. 4, and a constant current charging method.

In example 2, a test is conducted for determination of charging parameters, wherein a maximum output current of 100 A (i.e., 1 C) is set for the test. The charging parameters for a five-stage charging mode are: 90 A (0.9 C), 82.5 A (0.825 C), 65 A (0.65 C), 52.5 A (0.525 C), 42.5 A (0.425 C); and a trickle charging parameter is: 15 A (0.15 C), wherein a voltage of 460V is set. Referring to FIGS. 8A and 8B, FIG. 8A is a diagram of battery temperature with respect to time, illustrating both tests respectively according to charging control as indicated in block S20 of FIG. 4 (curve C21), and a constant current charging method (curve C22), and FIG. 8B is a diagram of battery voltage with respect to time, illustrating both an example according to charging control as indicated in block S20 of FIG. 4 (curve C31), and a constant current charging method (curve C32).

Example 3

Figure 9A:
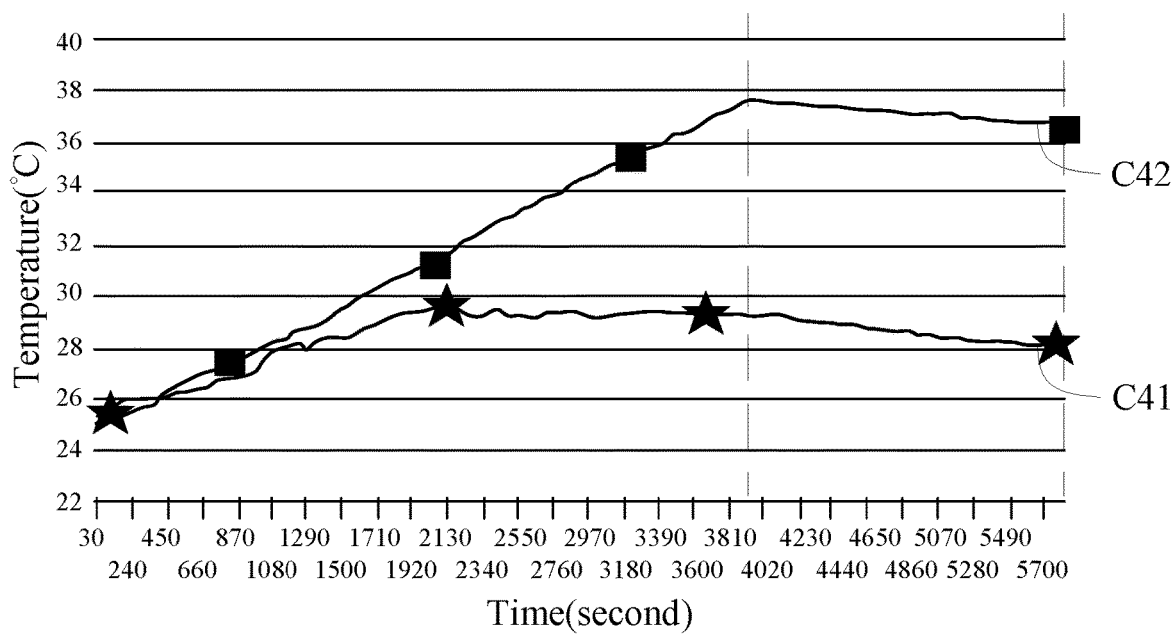
FIG. 9A is a diagram of battery temperature with respect to time, illustrating both tests respectively according to charging control as indicated in block S20 of FIG. 4, and a constant current charging method.
Figure 9B:
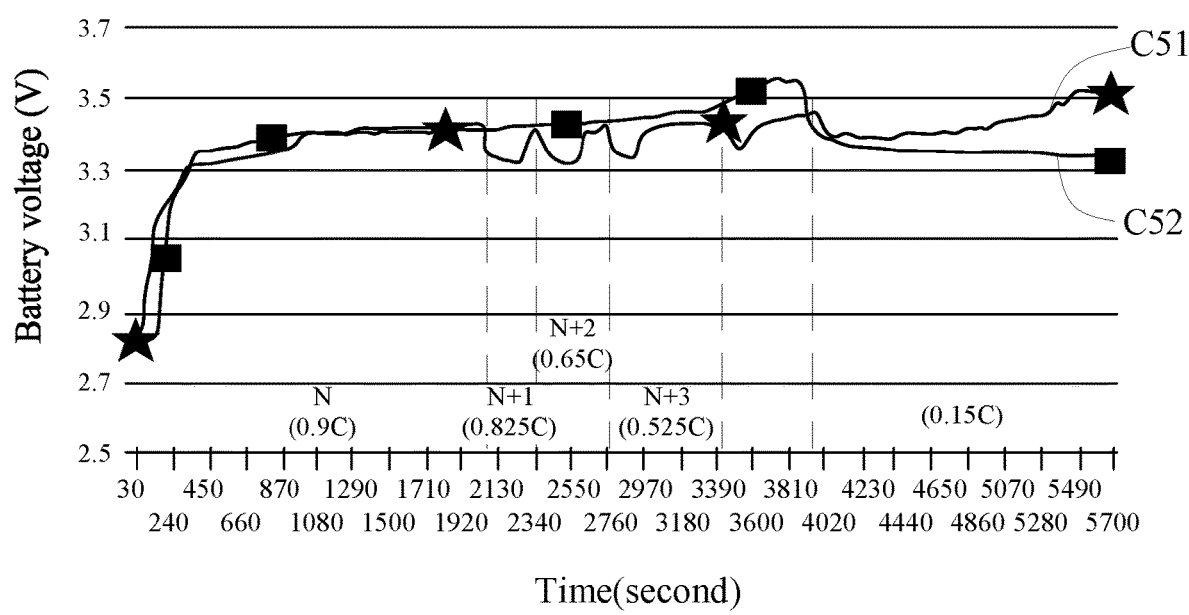
FIG. 9B is a diagram of battery voltage with respect to time, illustrating both tests respectively according to charging control as indicated in block S20 of FIG. 4, and a constant current charging method.

In example 3, a test is conducted for determination of charging parameters, wherein a maximum output current of 100 A (i.e., 1 C) is set for the test. The charging parameters for a five-stage charging mode are: 90 A (0.9 C), 82.5 A (0.825 C), 60 A (0.60 C), 52.5 A (0.525 C), 42.5 A (0.425 C); and a trickle charging parameter is: 15 A (0.15 C), wherein a voltage of 460V is set. Referring to FIGS. 9A and 9B, FIG. 9A is a diagram of battery temperature with respect to time, illustrating both tests respectively according to charging control as indicated in block S20 of FIG. 4 (curve C41), and a constant current charging method (curve C42), and FIG. 9B is a diagram of battery voltage with respect to time, illustrating both tests respectively according to charging control as indicated in block S20 of FIG. 4 (curve C51), and a constant current charging method (curve C51).

As can be observed from FIGS. 7 and 9A, during the charging of a battery set by the constant current charging method, the temperature of the battery set is increased to 36° C., that is, a temperature rise of about 12° C. On the other hand, the temperature rise of a battery set can be controlled within 5° C. effectively during the charging of a battery set by using the intelligent charging mode. Hence, applying the intelligent charging mode to the charging of a battery set can prevent the impact on a decline in battery life due to the battery set being in higher temperatures.

Figure 10:
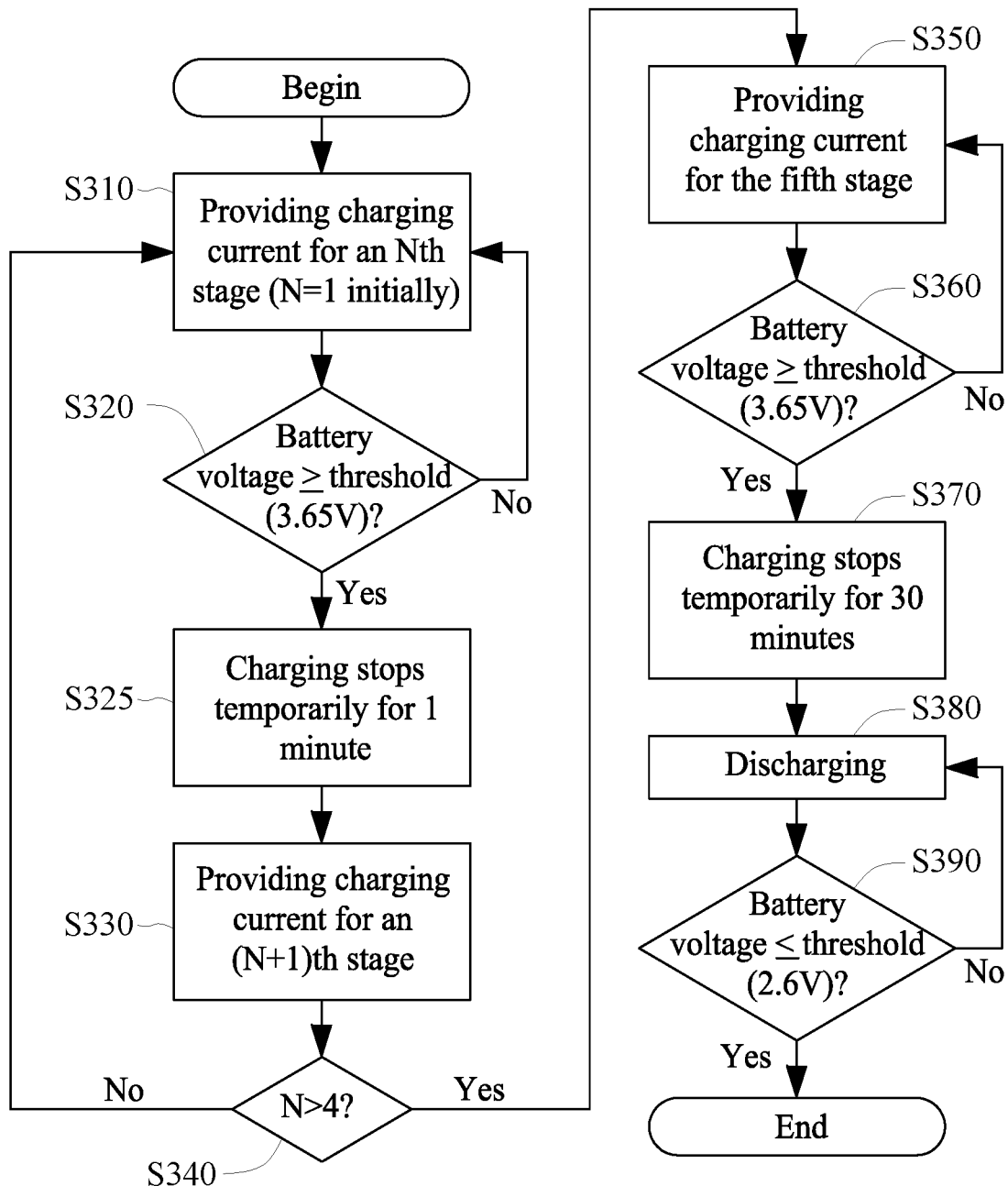
FIG. 10 is a flowchart illustrating a charging test method according to an embodiment of the present disclosure.

In the following example, a method for determining optimal parameters for a five-stage charging mode. An implementation can be made based on this method in the charging control device so as to achieve a mode for optimizing battery charging parameters. In this example, charging testing as illustrated in FIG. 10 adopts a five-stage charging mode. In FIG. 10, as shown at block S310, testing begins at an Nth stage; initially, N=1, indicating that charging a battery (or battery set) by using a charging current of a first stage. As shown at block S320, it is determined whether the voltage of the battery (or remaining capacity) is greater than or equal to a corresponding threshold (e.g., 3.65V); if not, it is continued to charge the battery by using the charging current of the N-th stage; if so, as shown at block S330, a next stage is entered, charging the battery by using the charging current of an (N+1)th stage, e.g., 2nd stage. As such, blocks S310 to S340 are repeated until the last stage is reached. In the last stage, N=5, as shown at block S350, the battery is charged by using the charging current of an (N+1)th stage. In block S360, if the voltage of the battery (or remaining capacity) is greater than or equal to a corresponding threshold (e.g., 3.65V), the charging is completed. In addition, after the completion of the charging in each stage, charging stops temporarily for a period of time (e.g., 1 minute) in the testing, as shown at block S325, so that the internal chemical properties of the battery is restored to its steady state. After the completion of the five stage of charging, charging stops temporarily for a longer period of time (e.g., 30 minute), as shown at block S370, so that the internal chemical properties of the battery is restored to its steady state. After that, as shown at block S380, discharging is performed on the battery, and as shown at block S390, it is determined whether the voltage of the battery (or remaining capacity) is less than or equal to a corresponding threshold (e.g., 2.6V); if not, the discharging continues; if so, the discharging is completed. In this manner, the charging and discharging testing is completed for one time. In order to optimize the charging parameters of the five-stage charging mode, a charging mode algorithm is performed based on the testing in FIG. 10 and orthogonal array (OA) of Taguchi method. The charging mode algorithm will take the advantage of Taguchi method to reduce the number of testing required and save the cost and time.

In order to achieve the shortest charging time, maximum charging power, lowest temperature rise, battery life extension and other goals, in the present embodiment, the influence factor is designed for the charging current and the battery temperature. In this way, the quality characteristic of Taguchi method can be expressed by formula (1). In formula (1), Q indicates charging capacity of a battery (or a battery set); t represents the charging time; $(\overline{T}-T_0)$ indicates an average temperature rise; and y is the quality characteristic. By the purpose of battery life extension, it implies that the greater the value of the quality characteristic is, the longer the battery life will be.

$$y = \frac{Q}{t \times (\overline{T} - T_0)} \quad \text{Formula (1)}$$

In the following testing based on the experience of the literature on charging technique, three levels are assigned, namely a high level (indicated by Level1$^+$), a middle level (indicated by Level1$^0$), a low level (indicated by Level1$^-$). In addition, each level is associated with five influence factors. Initially, the charging current of the first stage at the high level is set to 1 C (C indicating the battery capacity), as illustrated in Table 1, according to the suggestion of the literature. For instance, if the battery capacity is 50 Ah, the charging current of 1 C corresponds to 50 A.

Table 1 lists the parameters for testing as follows:

TABLE 1

| (Unit: C) | I1 | I2 | I3 | I4 | I5 |
|---|---|---|---|---|---|
| Level1$^+$ | 1 | 0.875 | 0.75 | 0.625 | 0.5 |
| Level1$^0$ | 0.95 | 0.825 | 0.7 | 0.575 | 0.45 |
| Level1$^-$ | 0.9 | 0.775 | 0.65 | 0.525 | 0.4 |

In the testing, an appropriate orthogonal table is selected, for example, orthogonal table L18($2^1*3^7$). As shown in Table 2, the testing design in this example adopts 3 levels and 5 influence factors, and thus the remaining parameters will not be taken. Afterwards, testing can be conducted according to the parameters in Table 2. Firstly, charging is performed by using a charging current of the first stage. If the battery voltage reaches 3.65V, the charging stops temporarily for a minute and then a next stage of charging is performed. Similar processes as above are repeated until the battery voltage in the five stage reaches 3.65V. When the battery voltage in the five stage reaches 3.65V, the charging process is completed for this time and then the charging stops temporarily for 30 minutes. After that, discharging is performed on the charged battery and the voltage of the battery being discharged is detected. When the voltage of the battery being discharged reaches 2.6V, the discharging process is completed for this time.

Table 2 is a reduced version of orthogonal table L18 ($2^1*3^7$), wherein 3 levels and 5 influence factors are adopted, as follows.

TABLE 2

| L18($2^1 * 3^7$) | $I_1$ | $I_2$ | $I_3$ | $I_4$ | $I_5$ |
|---|---|---|---|---|---|
| 1 | 1 | 1 | 1 | 1 | 1 |
| 2 | 1 | 2 | 2 | 2 | 2 |
| 3 | 1 | 3 | 3 | 3 | 3 |
| 4 | 2 | 1 | 1 | 2 | 2 |
| 5 | 2 | 2 | 2 | 3 | 3 |
| 6 | 2 | 3 | 3 | 1 | 1 |
| 7 | 3 | 1 | 2 | 1 | 3 |
| 8 | 3 | 2 | 3 | 2 | 1 |
| 9 | 3 | 3 | 1 | 3 | 2 |
| 10 | 1 | 1 | 3 | 3 | 2 |
| 11 | 1 | 2 | 1 | 1 | 3 |
| 12 | 1 | 3 | 2 | 2 | 1 |
| 13 | 2 | 1 | 2 | 3 | 1 |
| 14 | 2 | 2 | 3 | 1 | 2 |
| 15 | 2 | 3 | 1 | 2 | 3 |
| 16 | 3 | 1 | 3 | 2 | 3 |
| 17 | 3 | 2 | 1 | 3 | 1 |
| 18 | 3 | 3 | 2 | 1 | 2 |

As such, the charging and discharging testing as shown in FIG. 10 is performed according to Table 2. After the testing has been completed, data analysis and the convergence of results of the testing are performed. When a charging criterion is related to a middle level or a high level, the convergence is performed. If the convergence is performed such that the differences among the levels are about ±0.025 C, the whole testing will be stopped. As an example, the testing parameters of the first testing are showed in Table 3, and the results of the first testing is shown in Table 4.

Table 3 lists the parameters which are set for the first testing as follows.

TABLE 3

| (Unit: C) | $I_1$ | $I_2$ | $I_3$ | $I_4$ | $I_5$ |
|---|---|---|---|---|---|
| Level1$^+$ | 1 | 0.875 | 0.75 | 0.625 | 0.5 |
| Level1$^0$ | 0.95 | 0.825 | 0.7 | 0.575 | 0.45 |
| Level1$^-$ | 0.9 | 0.775 | 0.65 | 0.525 | 0.4 |

Table 4 lists the results of the first testing as follows.

TABLE 4

| $L_{18}$ ($2^1 * 3^7$) orthogonal table | Initial temperature ($T_0$) | Average temperature ($\bar{T}$) | Charging time (t) | Charging capacity (Q) | Quality characteristic (y) |
|---|---|---|---|---|---|
| $1^{st}$ | 23.3 | 25.81 | 3711 | 46395.89 | 4.980 |
| $5^{th}$ | 22.5 | 25.411 | 3877 | 46115.95 | 4.086 |
| $8^{th}$ | 23 | 25.318 | 3977 | 46025.51 | 4.992 |
| $11^{th}$ | 22.8 | 25.5 | 3746 | 46268.9 | 4.574 |
| $14^{th}$ | 22.7 | 25.628 | 3881 | 46574.69 | 4.098 |

By the results of the first testing, it is indicated that the optimal quality characteristic results are the testing results that are obtained for the eighth set of parameters, as shown in Table 5. Because the criteria for stopping the whole testing have not been satisfied for the eighth set of parameters, the convergence is conducted for generating the standard for initial testing parameters for the design of parameters of the second testing, as shown in Table 6. The second testing can then be conducted based on the parameters in Table 6, and the results of the second testing are shown in Table 7.

Table 5 lists the optimal parameters of the first testing as follows.

TABLE 5

| (Unit: C) | $I_1$ | $I_2$ | $I_3$ | $I_4$ | $I_5$ |
|---|---|---|---|---|---|
| Level1$^+$ | 1 | 0.875 | 0.75 | 0.625 | 0.5 |
| Level1$^0$ | 0.95 | 0.825 | 0.7 | 0.575 | 0.45 |
| Level1$^-$ | 0.9 | 0.775 | 0.65 | 0.525 | 0.4 |

Table 6 shows the parameter design for the second testing.

TABLE 6

| (Unit: C) | $I_1$ | $I_2$ | $I_3$ | $I_4$ | $I_5$ |
|---|---|---|---|---|---|
| Level1$^+$ | 0.95 | 0.85 | 0.7 | 0.6 | 0.5 |
| Level1$^0$ | 0.9 | 0.825 | 0.65 | 0.575 | 0.475 |
| Level1$^-$ | 0.85 | 0.8 | 0.6 | 0.55 | 0.45 |

Table 7 lists the result of the second testing.

TABLE 7

| $L_{18}$($2^1*3^7$) orthogonal table | Initial temperature ($T_0$) | Average temperature ($\bar{T}$) | Charging time (t) | Charging capacity (Q) | Quality characteristic (y) |
|---|---|---|---|---|---|
| $1^{st}$ | 23 | 25.623 | 3799 | 46300.54 | 4.464 |
| $5^{th}$ | 23.1 | 24.960 | 4113 | 46789.03 | 6.116 |
| $11^{th}$ | 23.7 | 25.910 | 3917 | 46549.69 | 5.377 |
| $12^{th}$ | 23.3 | 26.01 | 3868 | 46375.78 | 4.439 |
| $14^{th}$ | 22.8 | 25.140 | 4007 | 45851.69 | 4.890 |

By the results of the second testing, it is indicated that the optimal quality characteristic results are the testing results obtained for the fifth set of parameters, as shown in Table 8. Because the criteria for stopping the whole testing have not been satisfied for the fifth set of parameters, parameters of the third testing, as shown in Table 9, are designed according to the process for the first testing. The third testing can then be conducted based on the parameters in Table 9, and the results of the third testing are shown in Table 10.

Table 8 lists the optimal parameters of the second testing as follows.

TABLE 8

| (Unit: C) | $I_1$ | $I_2$ | $I_3$ | $I_4$ | $I_5$ |
|---|---|---|---|---|---|
| Level1$^+$ | 0.95 | 0.85 | 0.7 | 0.6 | 0.5 |
| Level1$^0$ | 0.9 | 0.825 | 0.65 | 0.575 | 0.475 |
| Level1$^-$ | 0.85 | 0.8 | 0.6 | 0.55 | 0.45 |

Table 9 shows the parameter design for the third testing as follows.

TABLE 9

| (Unit: C) | $I_1$ | $I_2$ | $I_3$ | $I_4$ | $I_5$ |
|---|---|---|---|---|---|
| Level1$^+$ | 0.925 | 0.8375 | 0.675 | 0.575 | 0.475 |
| Level1$^0$ | 0.9 | 0.825 | 0.65 | 0.55 | 0.45 |
| Level1$^-$ | 0.875 | 0.8125 | 0.625 | 0.525 | 0.425 |

Table 10 lists the result of the third testing.

TABLE 10

| $L_{18}$($2^1*3^7$) orthogonal table | Initial temperature ($T_0$) | Average temperature ($\bar{T}$) | Charging time (t) | Charging capacity (Q) | Quality characteristic (y) |
|---|---|---|---|---|---|
| $1^{st}$ | 23 | 25.254 | 3912 | 46851.64 | 5.313 |
| $5^{th}$ | 23 | 25.028 | 3998 | 45647.96 | 5.630 |
| $11^{th}$ | 22.6 | 25.518 | 3970 | 45924.52 | 3.964 |
| $12^{th}$ | 22.5 | 25.498 | 3981 | 46304.14 | 3.880 |
| $14^{th}$ | 22.7 | 25.202 | 4059 | 46157.02 | 4.545 |

In the orthogonal table for the third testing, the optimal one is the fifth set of parameters for testing, as shown in Table 11. Because the criterion for convergence of the present example are satisfied among levels for charging current parameters at each stage for the fifth set of parameters, that is, the criteria for stopping the whole testing that the differences among the levels are about ±0.025 C are satisfied, the whole testing is stopped. The optimized charging currents I1 to I5 for the five stages are 0.9 C, 0.825 C, 0.65 C, 0.525 C, 0.425 C, respectively.

Table 11 shows the optimal parameter for the third testing.

TABLE 11

| (Unit: C) | $I_1$ | $I_2$ | $I_3$ | $I_4$ | $I_5$ |
|---|---|---|---|---|---|
| Level1$^+$ | 0.925 | 0.8375 | 0.675 | 0.575 | 0.475 |
| Level1$^0$ | 0.9 | 0.825 | 0.65 | 0.55 | 0.45 |
| Level1$^-$ | 0.875 | 0.7875 | 0.625 | 0.525 | 0.425 |

Furthermore, in some embodiments, a non-transitory computer readable recording medium is provided, which stores program code for causing a computing device (e.g., the charging control device) to perform any one or combination of the embodiments according to the charging control method. For example, the program code includes one or more programs or program modules, for realizing blocks S10 to S40, wherein the program code of the programs (or program modules) operate together and in any appropriate sequence. When the program code is executed by the computing device (e.g., the charging control device according to any embodiment of FIGS. 1 to 3) performs, the computing device is caused to perform an embodiment of the charging control method according to FIG. 4. The examples of the recording medium are, but not limited to: optical data storage medium, magnetic data storage medium, or memory device, such as memory card, firmware, ROM, or RAM; for example, a recording medium of a server for an application store (App store) that stores an application (APP) according to an embodiment of the processing method of the present disclosure, a recording medium of the computing device that stores an application (APP) according to an embodiment of the processing method of the present disclosure, or a memory card that stores an application (APP) according to an embodiment of the processing method of the present disclosure.

The embodiments of the charging control technique are provided as above, which are capable of automatically selecting a charging mode of high efficiency and low temperature rise, based on criteria of dynamic state(s) of a battery set, such as criteria of at least voltage or remaining capacity, or temperature, of the battery set. In this way, an appropriate charging strategy can be performed dynamically or intelligently according to the amount of electricity and the degree of aging of the battery set, when being charged, by an embodiment according to the charging control method or apparatus, so as to obtain a suitable charging mode and to ensure that the battery set is to be charged in a manner of low temperature rise and high charging capacity. A charging control system such as an electric vehicle or a charging station can be implemented based on an embodiment of the charging control method or apparatus according to the present disclosure. In addition, an implementation can also be conducted for cooperation of the charging control method or apparatus with a conventional charger unit to provide enhanced functionality, thereby establishing charging environment with intelligence and safety for the battery set.

While the present disclosure has been described by means of specific embodiments, numerous modifications and variations could be made thereto by those skilled in the art without departing from the scope and spirit of the present disclosure set forth in the claims.

What is claimed is:

1. A charging control apparatus, comprising:
    a memory unit;
    a processing unit, coupled to the memory unit, wherein the processing unit is configured to:
        obtain an electrical state of a battery set from a battery management unit;
        determine whether the electrical state is greater than a first electrical state threshold and accordingly perform charging control based on a first charging mode or a second charging mode on the battery set;
        during performing the charging control on the battery set, determine at least one temperature difference value based on temperature values of the battery set at different times obtained from the battery management unit;
        determine whether the temperature difference value is greater than a first temperature difference threshold and accordingly determine whether to temporarily stop or continue the charging of the battery set; and
        during performing the charging control on the battery set, obtain the electrical state of the battery set from the battery management unit, and determine whether the electrical state satisfies a fully-charged criterion and accordingly determine whether to stop or continue the charging control of the battery set.

2. The charging control apparatus according to claim 1, wherein the charging control device apparatus comprises:
    a device communication unit, coupled to the processing unit, for communication between the battery management unit and a programmable charger.

3. The charging control apparatus according to claim 1, wherein when the processing unit determines that the electrical state is greater than the first electrical state threshold, the processing unit performs the charging control based on the first charging mode on the battery set; when the processing unit determines that the electrical state is less than or equal to the first electrical state threshold, the processing unit performs the charging control based on the second charging mode on the battery set.

4. The charging control apparatus according to claim 1, wherein the processing unit at least sends a first control signal so as to apply a first charging current, based on the first charging mode, for charging the battery set.

5. The charging control apparatus according to claim 4, wherein during performing the charging control based on the second charging mode on the battery set, the processing unit sends a plurality of second control signals individually so as to apply corresponding second charging currents for charging the battery set, wherein the first charging current corresponding to the first control signal is less than the second charging currents corresponding to the second control signals.

6. The charging control apparatus according to claim 1, wherein when the processing unit determines that the temperature difference value is greater than the first temperature difference threshold, the processing unit temporarily stops charging on the battery set; when the processing unit determines that the temperature difference value is less than or equal to the first temperature difference threshold, the processing unit continues charging on the battery set.

7. A charging control method for a charging control device, the charging control method comprising:
    (a) obtaining, by the charging control device, an electrical state of a battery set from a battery management unit;
    (b) determining, by the charging control device, whether the electrical state is greater than a first electrical state threshold and accordingly performing, by the charging control device, charging control based on a first charging mode or a second charging mode on the battery set;
    (c) during performing the charging control on the battery set, determining, by the charging control device, at least one temperature difference value based on temperature values of the battery set at different times obtained from the battery management unit;
    (d) determining, by the charging control device, whether the temperature difference value is greater than a first temperature difference threshold and accordingly determining, by the charging control device, whether to temporarily stop or continue the charging of the battery set; and (e) during performing the charging control on the battery set, obtaining, by the charging control device, the electrical state of the battery set from the battery management unit, and determining, by the charging control device, whether the electrical state satisfies a fully-charged criterion and accordingly determining, by the charging control device, whether to stop or continue the charging control of the battery set.

8. The charging control method according to claim 7, wherein in the step (b), if it is determined that the electrical state is greater than the first electrical state threshold, the charging control is performed based on the first charging mode on the battery set; if it is determined that the electrical state is less than or equal to the first electrical state threshold, the charging control is performed based on the second charging mode on the battery set.

9. The charging control method according to claim 7, wherein in the step (b), performing the charging control based on a first charging mode comprises: sending a first control signal so as to apply a first charging current for charging the battery set; during performing the charging control based on the second charging mode on the battery set, sending a plurality of second control signals individually so as to apply corresponding second charging currents for charging the battery set, wherein the first charging current corresponding to the first control signal is less than the second charging currents corresponding to the second control signals.

10. The charging control method according to claim 7, wherein in the step (d), if it is determined that the temperature difference value is greater than the first temperature difference threshold, the charging on the battery set is temporarily stopped; if it is determined that the temperature difference value is less than or equal to the first temperature difference threshold, the charging on the battery set is continued.

11. A non-transitory computer readable medium, in which program code is stored for causing a computing device to perform a charging control method, wherein the method comprises:

(a) obtaining an electrical state of a battery set;
(b) determining whether the electrical state is greater than a first electrical state threshold and accordingly performing charging control based on a first charging mode or a second charging mode on the battery set;
(c) during performing the charging control on the battery set, obtaining temperature values of the battery set at different times so as to determine at least one temperature difference value;
(d) determining whether the temperature difference value is greater than a first temperature difference threshold and accordingly determining whether to temporarily stop or continue the charging of the battery set; and
(e) during performing the charging control on the battery set, obtaining the electrical state of the battery set, and determining whether the electrical state satisfies a fully-charged criterion and accordingly determining whether to stop or continue the charging control of the battery set.

12. The non-transitory computer readable medium according to claim 11, wherein in the step (b), if it is determined that the electrical state is greater than the first electrical state threshold, the charging control is performed based on the first charging mode on the battery set; if it is determined that the electrical state is less than or equal to the first electrical state threshold, the charging control is performed based on the second charging mode on the battery set.

13. The non-transitory computer readable medium according to claim 11, wherein in the step (b), performing the charging control based on a first charging mode comprises: sending a first control signal so as to apply a first charging current for charging the battery set; during performing the charging control based on the second charging mode on the battery set, sending a plurality of second control signals individually so as to apply corresponding second charging currents for charging the battery set, wherein the first charging current corresponding to the first control signal is less than the second charging currents corresponding to the second control signals.

14. The non-transitory computer readable medium according to claim 11, wherein in the step (d), if it is determined that the temperature difference value is greater than the first temperature difference threshold, the charging on the battery set is temporarily stopped; if it is determined that the temperature difference value is less than or equal to the first temperature difference threshold, the charging on the battery set is continued.

* * * * *